US012663309B2

(12) United States Patent　　　(10) Patent No.: US 12,663,309 B2

Ghosh　　　(45) Date of Patent: Jun. 23, 2026

(54) SYSTEM AND METHOD FOR ENABLING HIGH SPEED OPTICAL COMMUNICATION INSIDE AND BETWEEN PC BOARDS, 3D MULTI-CHIP MODULES AND OTHER ELECTRONIC SYSTEMS

(71) Applicant: Chuni L. Ghosh, Princeton Junction, NJ (US)

(72) Inventor: Chuni L. Ghosh, Princeton Junction, NJ (US)

( * ) Notice: Subject to any disclaimer, the term of this patent is extended or adjusted under 35 U.S.C. 154(b) by 0 days.

(21) Appl. No.: 19/245,111

(22) Filed: Jun. 20, 2025

(65) Prior Publication Data

US 2026/0049865 A1　　Feb. 19, 2026

Related U.S. Application Data

(60) Provisional application No. 63/684,011, filed on Aug. 16, 2024.

(51) Int. Cl.
*G01J 1/04*　　(2006.01)
*H10F 55/25*　　(2025.01)

(52) U.S. Cl.
CPC ............ *G01J 1/0411* (2013.01); *H10F 55/25* (2025.01)

(58) Field of Classification Search
CPC ............................... H10F 55/25; G01J 1/0411
See application file for complete search history.

(56) References Cited

U.S. PATENT DOCUMENTS

| | | |
|---|---|---|
| 7,546,002 B2 | 6/2009 | Cho et al. |
| 7,570,849 B2 | 8/2009 | Spillane et al. |
| 7,805,080 B2 | 9/2010 | Wang et al. |
| 8,611,756 B1 | 12/2013 | Wach |
| 11,404,850 B2 | 8/2022 | Lin et al. |
| 11,946,950 B2 | 4/2024 | Huebner et al. |
| 12,189,301 B2 | 1/2025 | Dietrich et al. |
| 2004/0037512 A1 | 2/2004 | Cho et al. |
| 2004/0202477 A1 | 10/2004 | Nagasaka et al. |
| 2006/0187798 A1 | 8/2006 | Ozawa et al. |
| 2009/0162004 A1 | 6/2009 | Johnson et al. |
| 2011/0274392 A1 | 11/2011 | Miyatake |
| 2012/0328240 A1* | 12/2012 | Ma ..................... H01Q 15/0086 |
| | | 385/33 |
| 2020/0049906 A1 | 2/2020 | Budd et al. |

(Continued)

FOREIGN PATENT DOCUMENTS

| | | |
|---|---|---|
| CN | 116472480 A | 7/2023 |
| CN | 117043948 A | 11/2023 |

(Continued)

*Primary Examiner* — Kevin K Pyo

(74) *Attorney, Agent, or Firm* — LaMorte & Associates PC

(57) ABSTRACT

A system for carrying light signal data between points in an electronic assembly. A light signal source is mounted at a first point. The light signal source emits the light signal along a first path. A light signal detector is mounted to a second point in the electronic assembly. A metalens is set in the first path that directs said light signal toward the light signal detector. If interim substrates are disposed between the first point and the second point, features are provided that enable the light signal to pass. In addition, a metalens can redirect the light signal away from the first path, correct distortions in the light signal and/or focus the light signal toward the light signal detector.

9 Claims, 9 Drawing Sheets

(56)     References Cited

U.S. PATENT DOCUMENTS

| | | |
|---|---|---|
| 2022/0091349 A1 | 3/2022 | Testa et al. |
| 2023/0066363 A1 | 3/2023 | Hsu et al. |
| 2023/0129843 A1 | 4/2023 | Kalman et al. |
| 2023/0204819 A1 | 6/2023 | Ahmed et al. |
| 2023/0280557 A1 | 9/2023 | Pezeshki et al. |

FOREIGN PATENT DOCUMENTS

| | | | |
|---|---|---|---|
| JP | 2006284781 A | 10/2006 | |
| JP | 2011043535 A | 3/2011 | |
| KR | 20100061022 A | 8/2011 | |
| WO | WO 2013/117555 A1 | 8/2013 | |
| WO | WO-2022200428 A1 * | 9/2022 | ......... G02B 6/12004 |

* cited by examiner

SYSTEM AND METHOD FOR ENABLING HIGH SPEED OPTICAL COMMUNICATION INSIDE AND BETWEEN PC BOARDS, 3D MULTI-CHIP MODULES AND OTHER ELECTRONIC SYSTEMS

RELATED APPLICATIONS

This application claims the benefit of U.S. Provisional Application No. 63/684,011, filed Aug. 16, 2024.

BACKGROUND OF THE INVENTION

1. Field of the Invention

In general, the present invention relates to data transfer configurations that are used to transfer data between locations on a circuit board or between separate circuit boards. More particularly, the present invention relates to optical data transfer systems that use beams of light to communicate data within an electronic assembly or between multiple electronic assemblies.

2. Prior Art Description

Most sophisticated electronic devices contain printed circuit boards (PCBs) and various integrated circuits, which are commonly referred to as microchips or simply as "chips." Microchips contain various electronic components, such as transistors, resistors, capacitors, and their interconnections. These components are etched onto semiconductor material, which is usually silicon based. The capabilities of a microchip depend largely upon the size of the microchip and the density of the integrated circuits formed thereon. As the component density of integrated circuits increase, the performance of microchips has shifted away from a single large microchip to the use of chiplets and 3D multi-chip modules. Chiplets can be linked to mimic large single high complexity microchips such as large CPU/GPUs or AI processor chips. In chiplets, the semiconductor chips are mounted on the PCBs in close proximity to each other to build a complete large single chip-like system or subsystem. The components in the chiplets must work together with very high-speed data communication to mimic the performance of the single large chip being emulated. In certain chiplets, for example in high performance chiplets for AI (Artificial Intelligence), a number of processors such as CPUs, GPUs, and a number of high speed memories are put in close proximity. This enables the processors to process a large volume of data extracted from the memories at a high speed without the need to traverse long physical distances through electrical interconnections. The processors and the memories, as well as other components, need high speed data transfer between them for real time applications.

Transmission speeds and bandwidth are becoming a problem for large chiplets including AI hardware and other applications requiring a large volume of data transfer between components. The problem is even more severe for 3D modules that incorporate processors, memories, and other types of chips for complex systems. In the case of 3D modules, the data is transferred from one layer of the board to another through via holes. If the substrate is silicon, sometimes called silicon interposers, the via holes in them are called Through Silicon Vias or TSVs. TSVs are used where multiple boards or silicon substrates on top of each other are connected through via holes that are filled with metals through which data transmission takes place between different layers of silicon substrates/interposers or PCBs. However, there is a limit on how much data throughput can be transferred through the via holes. Typically, for metal filled vias, the maximum transmission rate is approximately 10 Gb/s.

In many high-speed systems, manufacturers try to overcome the speed bottleneck of data transmission by using fiber optical connections. This is typically done by connecting multiple PCBs using optical fibers. However, optical fibers and required integration hardware are expensive. Furthermore, optical fibers have minimum curvature radii that require the optical fibers to take up a lot of space in a confined electronic device.

In U.S. Pat. No. 12,189,301 to Dietrich, a system is shown where data can be transmitted optically between optical printed circuit boards. Direct communications, without use of connecting optical fibers, require unobstructed line of sight between communication points. The need to provide unobstructed lines of sight within the densely packed electronics of many modern devices is a severe design limitation. Furthermore, the Dietrich Patent requires the use of separate lens elements that must be precisely mounted upon light sources and/or light detectors on a circuit board. Often the lens element required is much larger than the light source. This makes lens elements difficult to incorporate into dense circuit board designs and limits the degree of miniaturization that can be applied to circuitry on the circuit boards. The lens elements also greatly increase the difficulty and costs of producing such circuit boards.

A need therefore exists for an improved system and methodology for optically transmitting data between components on the same or different PC boards that is fast, has a large bandwidth, has a small layout footprint, and does not require unobstructed line of sight. These needs are met by the present invention as described and claimed below.

SUMMARY OF THE INVENTION

A system for transmitting a light signal carrying data between points in an electronic assembly. A light signal source is mounted at a first point in the electronic assembly. The light signal source emits the light signal in a first direction along a first path. A light signal detector is mounted to a second point along the signal path.

Interim substrates can be disposed between the first substrate and the second substrate. Features are provided that enable the light signal to pass through each interim substrate as the light signal travels from the light signal source to said light signal detector. The features include holes and substrate materials that are transparent to the frequencies of light being produced by the light signal source.

The light signal source may pass through one or more metalenses, which are subwavelength planar structurers written on the semiconductor emitter devices or on glass. The metalenses can focus and bend the light signal from the source and direct it towards the light signal detector. The metalenses can also correct distortions in the light signal that may occur as the light signal travels from the light signal emitter to the light signal detector.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Although the present invention assembly and methodology can be embodied in many ways, only a few exemplary embodiments are illustrated. The exemplary embodiments are being shown for the purposes of explanation and description. The exemplary embodiments are selected in order to set forth some of the best modes contemplated for the invention. The illustrated embodiments, however, are merely exemplary and should not be considered limitations when interpreting the scope of the appended claims.

Figure 1:
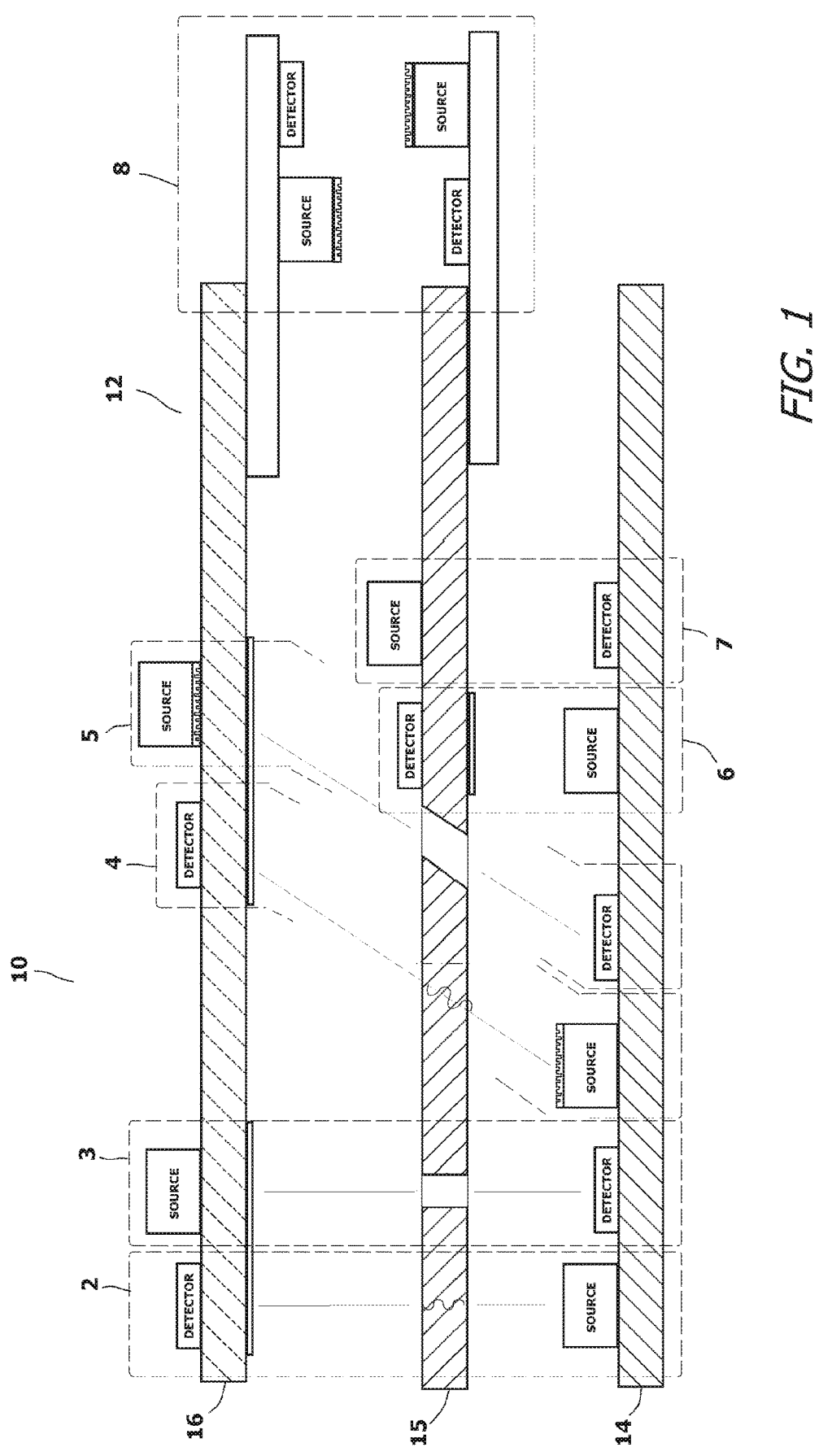
FIG. 1 shows an exemplary embodiment of an optical data transfer system containing three substrates, wherein multiple configurations for exchanging optical data among the substrates are illustrated.

Referring to FIG. 1, a stacked 3D configuration 12 of circuitry on substrates 14, 15, 16 is shown that illustrates different configurations for the present invention optical data transfer system 10. The purpose of the optical data transfer system 10 is to transfer data through open space between components on the different substrates or between positions on the same substrate. In the exemplary embodiment used for discussions, three substrates 14, 15, 16 are shown. The use of three substrates 14, 15, 16 is merely an example and it should be understood that any plurality of stacked substrates 14, 15, 16 can be used.

As will be explained, at least some of the substrates 14, 15, 16 can be traditional printed circuit boards that are made from fiberglass-based materials like FR4. Such traditional printed circuit boards can contain through holes. Alternatively, some of the substrates 14, 15, 16 can be made, at least in part, from materials that are transparent to the wavelengths of the light signal being transmitted.

Such substrates can be made from polycarbonate, transparent ceramics, glass, polyethylene terephthalate, glass-reinforced epoxy, liquid crystal polymers, and polymethyl methacrylate and silicon.

Alternatively, emitter wavelengths can be used at which the silicon interposers and the printed circuit board materials are transparent. For example, a board can be made from material that is transparent to infrared light and the light signal can be infrared. To facilitate discussion and understanding of the invention, the first substrate 14 in the illustrated embodiment is at the lowest elevation and is a traditional opaque printed circuit board. The third substrate 16 is at the highest elevation and has a substrate transparent to the frequencies of light in the light signal. The interim second substrate 15 is a substrate with holes. Alternately, the interim second substrate can have some areas or is entirely made of materials which are transparent to the emitted light from the emitters.

Data is transmitted between the substrates 14, 15, 16 by light signals. The light signals are produced by various light sources that are mounted to the substrates 14, 15, 16. The light sources can be light emitting diodes or lasers diode. If laser diodes are used, the laser diodes are intended to include Vertical Cavity Surface Emitting Lasers (VCSELs), photonic crystal surface emitting lasers (PSCELS), edge emitting lasers or light modulated by electro optical modulators such as lithium niobate-based modulators. The light signals are received by the light signals detectors, such as metal-semiconductor-metal (MSM) or other types of semiconductor photodetectors.

Figure 2:
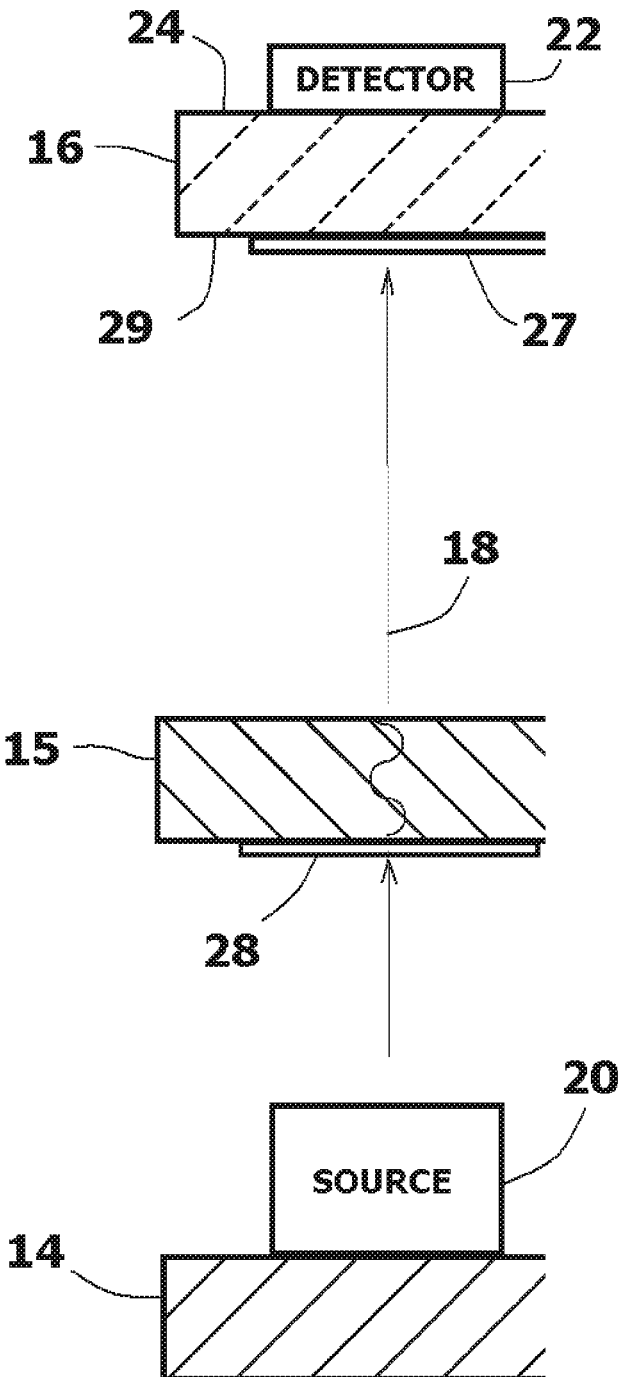
FIG. 2 is an enlarged view of a first optical data exchange configuration shown in area 2 of FIG. 1.

Referring to FIG. 2 in conjunction with FIG. 1, a first optical transmission configuration is shown. In this configuration, optical data is communicated between the first substrate 14 and the third substrate 16 via a light signal 18. The light signal 18 passes directly through the interim second substrate 15. In the shown embodiment, a first light signal source 20, such as a VCSEL, PCSEL, or other types of light emitter, is mounted to the first substrate 14. The first light signal source 20 emits the light signal 18 vertically in a first line. The light signal 18 emitted is preferably contained within a narrow wavelength range.

A first light signal detector 22 is mounted to the top surface 24 of the third substrate 16.

Accordingly, in order for the light signal 18 to travel from the first light signal source 20 to the first light signal detector 22, the light signal 18 must pass through both the second substrate 15 and the third substrate 16.

The second substrate 15 is transparent to wavelengths of the light signal 18 or contains an area that is transparent to the wavelengths of the light signal 18. In this manner, the light signal 18 can pass through the second substrate 15 and continue toward the third substrate 16. A layer of anti-reflective material 28 can optionally cover the bottom of the second substrate to prevent the light signal 18 from reflecting away and inadvertently affecting other optical components.

The light signal 18 passes through the second substrate 15 and strikes the bottom surface 29 of the third substrate 16 under the first light signal detector 22. The third substrate 16 is a transparent substrate that is made from material that is transparent to the wavelengths of light embodied by the light signal 18. As a result, the light signal 18 passes through the third substrate 16 and is received by the first light signal detector 22. A layer of anti-reflective material 27 can optionally cover the bottom of the bottom surface 29 of the third substrate 16 to prevent the light signal 18 from reflecting away from the third substrate 16. Since the light signal 18 is perpendicular to the third substrate 16, there is no appreciable losses due to reflection or diffraction.

Figure 3:
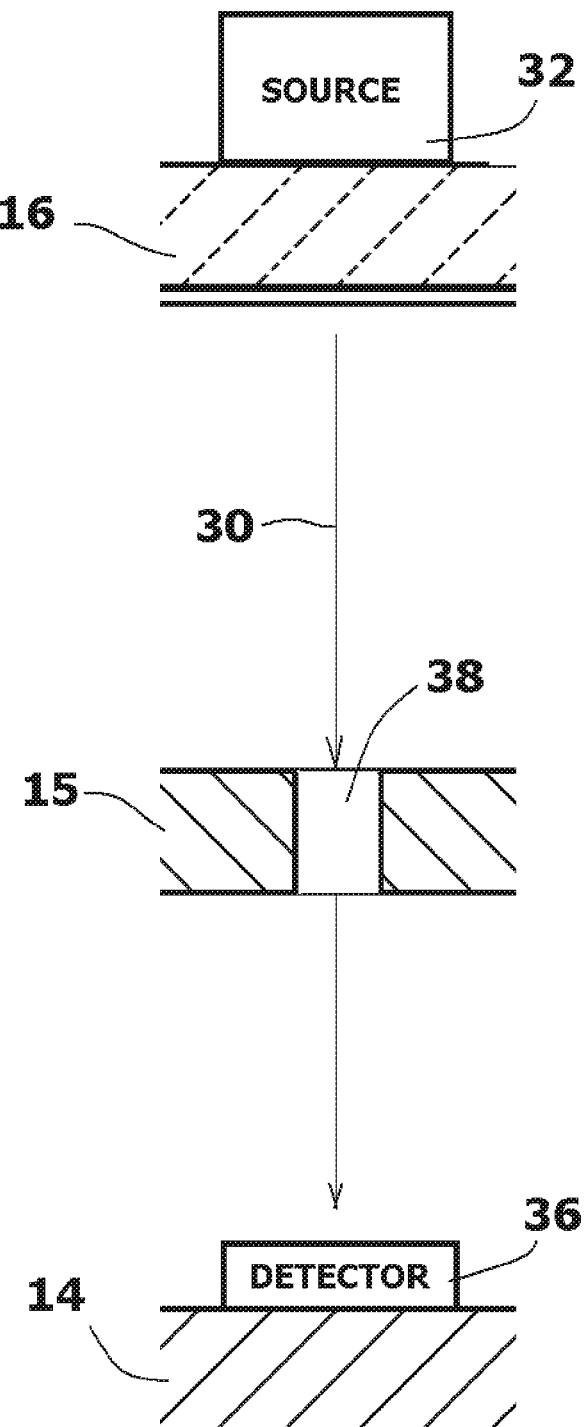
FIG. 3 is an enlarged view of a second optical data exchange configuration shown in area 3 of FIG. 1.

Referring to FIG. 3 in conjunction with FIG. 1, a second optical transmission configuration is shown. In this configuration, optical data is again being communicated between the first substrate 14 and the third substrate 16. The light signal 30 passes through at least one interim substrate 15. In the shown embodiment, a second light signal source 32, such as a VCSEL, PSCEL, or another light source is mounted to the third substrate 16 and is oriented to emit a light signal down toward the first substrate 14. The light emitted is preferably contained within a narrow wavelength range.

A second light signal detector 36 is mounted to the top surface of the first substrate 14. Accordingly, in order for the light signal to travel from the second light signal source 32 to the second light signal detector 36, the light signal must pass through the third substrate 16 and the second substrate 15.

A hole 38 is provided on the second substrate 15. The size of the hole 38 depends upon the distance between the third substrate 16 and the second substrate 15 as well as the beam spread of the second light signal source 32. The beam spread may be enlarged due to scattering or other mechanisms caused by the third substrate 16. The hole 38 is sized to ensure that a significant fraction of the light signal 30 passes without being blocked. In this manner, the light signal 30 can pass through the hole 38 in the second substrate 15 and continue toward the first substrate 14.

The light signal 30 passes through the second substrate 15 and strikes the second light signal detector 36. Prior to passing through the hole 38, the light signal 30 must pass through the third substrate 16. The third substrate 16 is transparent to the emitted light 30 from the light source 32. As a result, the light passes through the third substrate 16 without loss of data.

Figure 4:
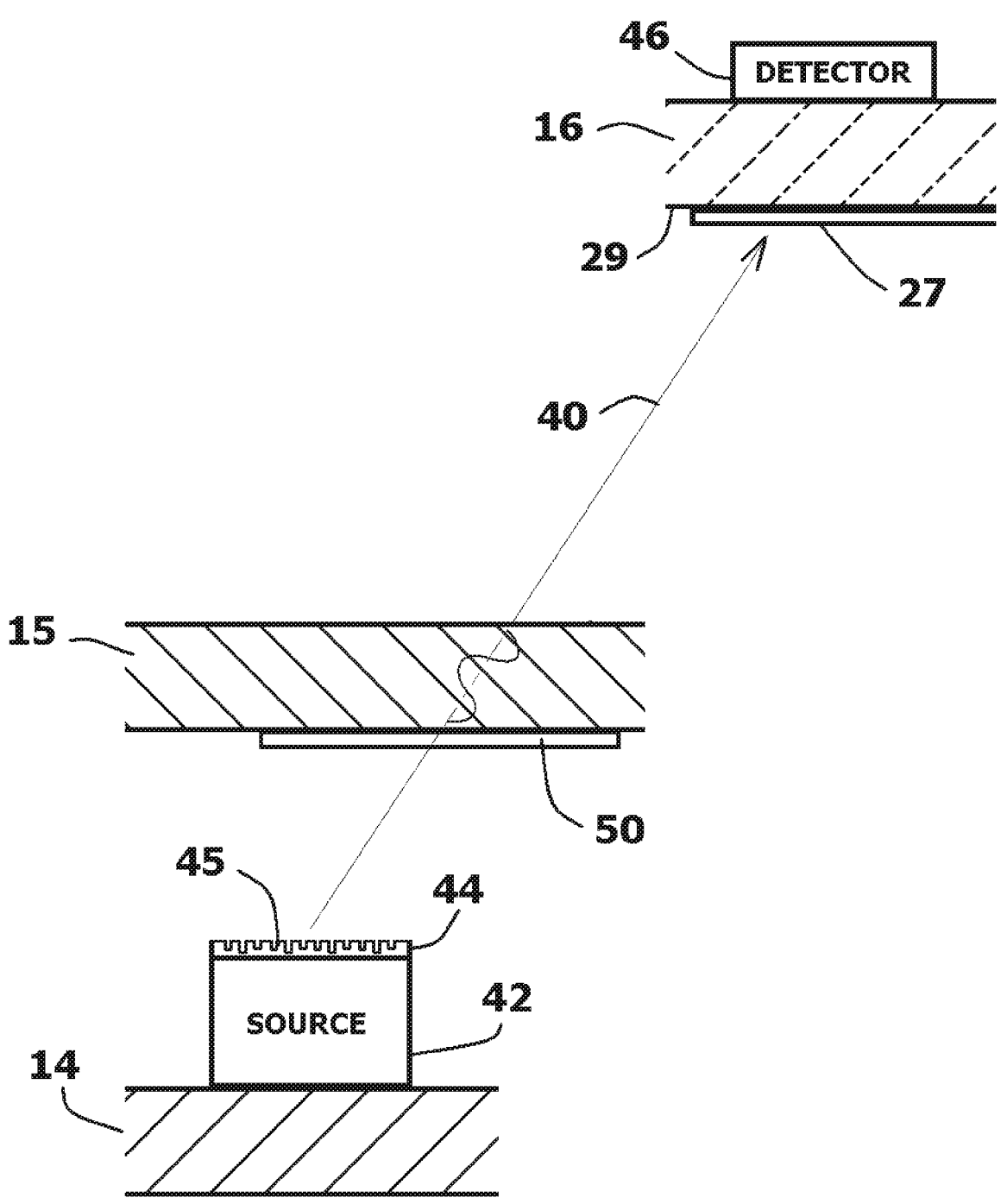
FIG. 4 is an enlarged view of a third optical data exchange configuration shown in area 4 of FIG. 1.

Referring to FIG. 4 in conjunction with FIG. 1, a third optical transmission configuration is shown. In this configuration, a light signal 40 is communicated between the first substrate 14 and the third substrate 16. The light signal 40 passes through at least one interim substrate 15. In the shown embodiment, a third light signal source 42, such as a VCSEL, PCSEL, or any other light signal source is mounted to the first substrate 14. A lens or a metalens element 44 is mounted to the third light signal source 42. The lens element 44 can be a glass lens, but is preferably a metalens 45. The metalens 45 has a metasurface of sub-wavelength-spaced structures that are fabricated using semiconductor deposition, lithography, and etching techniques. The metalens 45 is designed to receive, redirect, and focus the light signal 40 in a predetermined direction. That is, the light signal 40 is directed and focused to a point on the third substrate 16 that is offset from the third light signal source 42.

The third light signal source 42 emits the light signal 40. The metalens 45 directs the light signal toward the offset point on the third substrate 16. A third light signal detector 46 is mounted to the top surface of the third substrate 16. Accordingly, in order for the light signal 40 to travel from the third light signal source 42 to the third light signal detector 46, the light signal 40 must pass through both the second substrate 15 and the third substrate 16.

The second substrate 15 is, at least in part, transparent to wavelengths of the light signal 40. In this manner, the light signal 40 can pass through the second substrate 15 and continue toward the third substrate 16. The second substrate 15 will refract the light signal 40 due to the light signal 40 striking the second substrate at an angle of incidence. The metalens 45 is designed to alter the light signal 40 in a manner that corrects for the refraction. In this manner, the light signal 40 is corrected for the directional change due to refraction before the refraction occurs. A layer of anti-reflective material 50 can optionally cover the bottom of the second substrate 15 to prevent the light signal 40 from reflecting away significant intensity of the beam from the second substrate 15 and inadvertently affecting other optical components. The anti-reflective material 50 can be customized for the incoming angle of the light signal 40.

The light signal 40 passes through the second substrate 15 and strikes the bottom surface 29 of the third substrate 16 at a point that is offset from the third light signal source 42. The third substrate 16 is a transparent substrate that is made from material that is transparent to the wavelengths of light embodied by the light signal 40. As a result, the light passes through the third substrate 16 and is received by the third light signal detector 46. Again, since the light signal 40 strikes the third substrate 16 at an angle, some reflection and refraction of the light signal 40 occurs as the light passes through the third substrate 16. The metalens 45 is designed to alter the light signal 40 in a manner that corrects for this refraction as well. In this manner, the light signal 40 is corrected for all refraction distortions before any refraction occurs.

Figure 5:
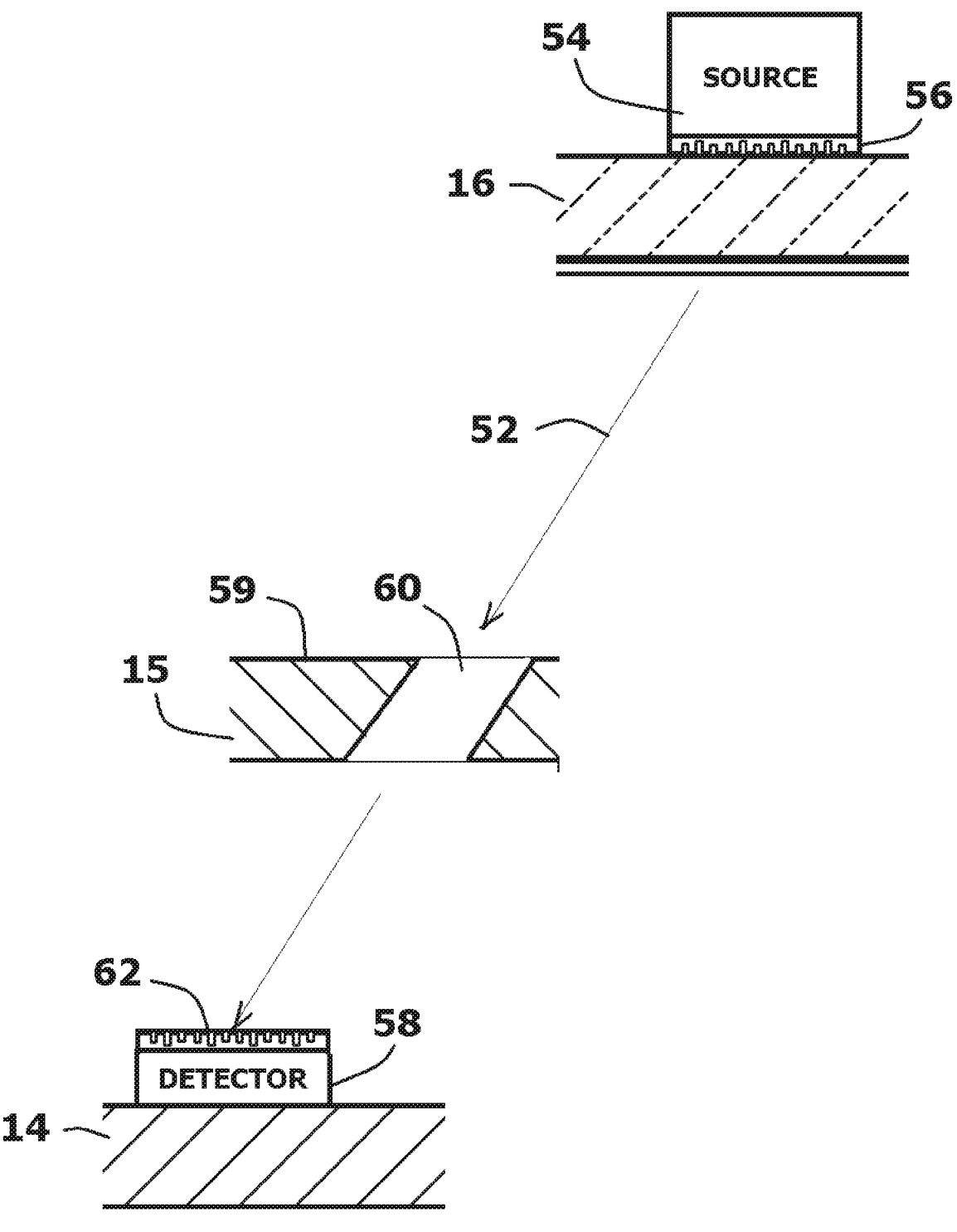
FIG. 5 is an enlarged view of a fourth optical data exchange configuration shown in area 5 of FIG. 1.

Referring to FIG. 5 in conjunction with FIG. 1, a fourth optical transmission configuration is shown. In this configuration, a light signal 52 is communicated between the first substrate 14 and the third substrate 16. The light signal 52 passes through at least one interim substrate 15. In the shown embodiment, a fourth light signal source 54 is mounted to the third substrate 16. A metalens 56 is mounted to, or formed on, the fourth light signal source 54. The metalens 56 is positioned between the fourth light signal source 54 and the third substrate 16. In this manner, the light signal 52 passes through the metalens 56 before it enters the third substrate 16. The metalens 56 has a metasurface of sub-wavelength-spaced structures that are fabricated using semiconductor deposition, lithography, and etching techniques. The metalens is designed to create, receive, correct, redirect, and focus the light signal in a predetermined direction. That is, the light signal 52 is directed and focused to a point on the first substrate 14 that is offset from the fourth light signal source 54.

The fourth light signal source 54 emits the light signal 52. The metalens 56 directs the light signal 52 toward the offset point on the first substrate 14. A fourth light signal detector 58 is mounted to the top surface of the first substrate 14. Accordingly, in order for the light signal 52 to travel from the fourth light signal source 54 to the fourth light signal detector 58, the light signal 52 must pass through both the third substrate 16 and the second substrate 15.

A hole 60 is provided on the second substrate 15. The hole 60 is formed optionally at an angle relative to the plane of the second substrate 15 to compensate for the beam angle of the light signal 52. Depending on the intensity of light beam, the hole may or may not be at an angle. The size of the hole 60 depends upon the distance between the third substrate 16 and the second substrate 15 as well as the beam spread of the fourth light signal source 54 and the angle of beam inclination. The hole 60 is sized to ensure that at least 98% of the light signal 52 passes without being blocked. In this manner, the light signal 52 can pass through the hole 60 and continue toward the first substrate 14.

The light signal 52 passes through the second substrate 15 and strikes the top surface of the first substrate 14 at a point that is offset from the fourth light signal source 54. The light signal strikes the fourth light signal detector 58 at an angle. A second metalens 62 is optionally formed atop the fourth light signal detector 58 to direct the light signal 52 into the fourth light signal detector 58.

Figure 6:
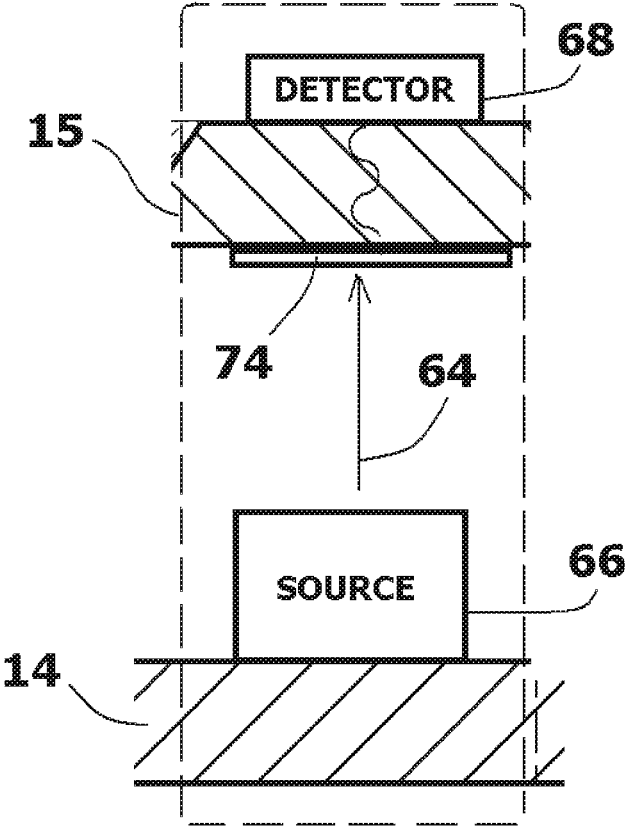
FIG. 6 is an enlarged view of a fifth optical data exchange configuration shown in area 6 of FIG. 1.

Referring to FIG. 6 in conjunction with FIG. 1, a fifth optical transmission configuration is shown. In this configuration, a light signal 64 is communicated between the first substrate 14 and the second substrate 15 without the light signal 64 passing through any other interim substrate. In the shown embodiment, a fifth light signal source 66 is mounted to the first substrate 14. The fifth light signal source 66 emits light vertically in a first line. The light emitted is preferably contained within a narrow wavelength range.

A fifth light signal detector 68 is mounted to the top surface 70 of the second substrate 15. Accordingly, in order for the light signal 64 to travel from the fifth light signal source 66 to the fifth light signal detector 68, the light signal 64 must pass through the second substrate 15.

The second substrate 15 directly below the fifth light signal detector 68 is transparent to wavelengths of the light signal 64. In this manner, the light signal 64 can pass through the second substrate 15 and continue to the fifth light signal detector 68. A layer of anti-reflective material 74 can optionally cover the bottom of the second substrate 15 to prevent the light signal 64 from reflecting away and inadvertently affecting other optical components.

Figure 7:
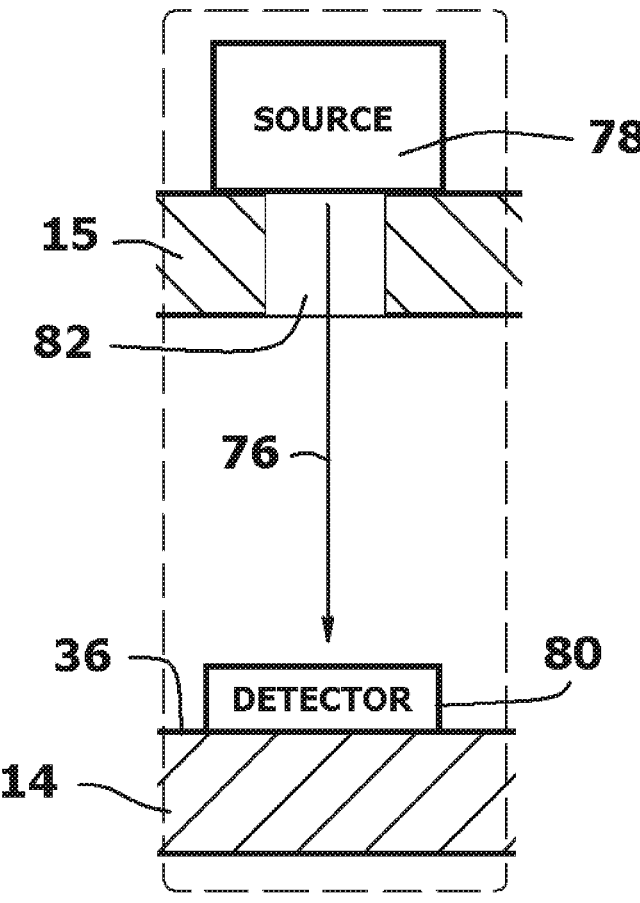
FIG. 7 is an enlarged view of a sixth optical data exchange configuration shown in area 7 of FIG. 1.

Referring to FIG. 7 in conjunction with FIG. 1, a sixth optical transmission configuration is shown. In this configuration, a light signal 76 carrying optical data is again being communicated between the first substrate 14 and the second substrate 15. In the shown embodiment, a sixth light signal source 78 is mounted to the second substrate 15 in an orientation that shines light down toward the first substrate 14.

A sixth light signal detector 80 is mounted to the top surface 59 of the first substrate 14. Accordingly, in order for the light signal 76 to travel from the sixth light signal source 78 to the sixth light signal detector 80, the light signal 76 must pass through the second substrate 15.

A hole 82 is provided on the second substrate 15 directly under the sixth light signal source 78. In this manner, the light signal 76 can pass through the hole 82 and continue toward the first substrate 14. The light signal 76 passes through the second substrate 15 and strikes the sixth light signal detector 80.

Figure 8:
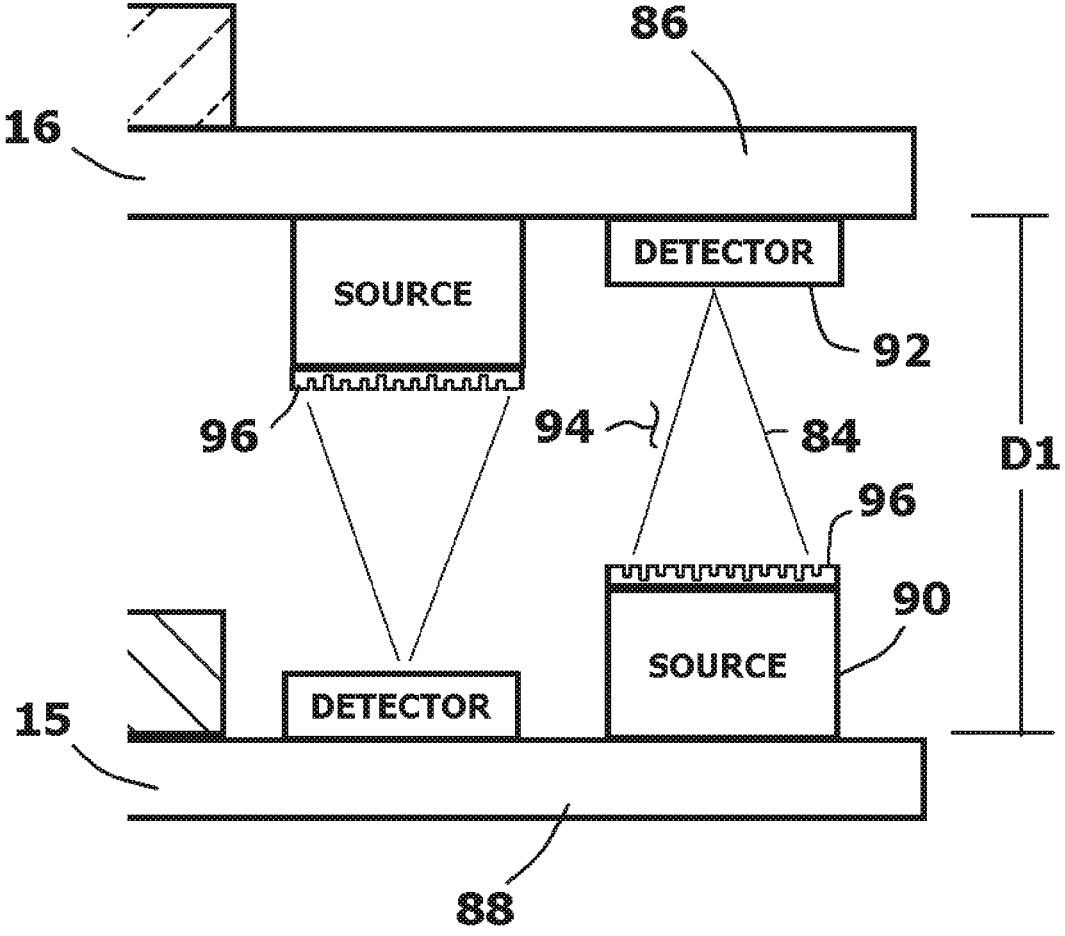
FIG. 8 is an enlarged view of a seventh optical data exchange configuration shown in area 8 of FIG. 1.

Referring to FIG. 8 in conjunction with FIG. 1, a seventh optical transmission configuration is shown. In this configuration, a light signal 84 carrying optical data is being directly communicated between the second substrate 15 and the third substrate 16. A small variation of this embodiment can also be used to communicate optical data to different points on the same substrate.

The second substrate 15 and the third substrate 16 are a distance D1 apart, wherein the distance D1 is between a few millimetres and several centimetres or more. Substrate extensions 86, 88 are mounted to the second substrate 15 and the third substrate 16. Seventh light signal sources 90 are mounted to the substrate extensions 86, 88. Likewise, seventh light signal detectors 92 are also mounted to the substrate extensions 86, 88. The substrate extensions 86, 88 extend outside the range of any intermediate substrate 15. As such, a clear gap space 94 exists between the substrate extensions 86, 88.

Metalenses 96 are provided to focus the light signals 84. The focal points created by the metalenses 96 are set to be equal to, or very near, the distance D1 of the gap space 94. In this manner, the light signals 84 are focused at the seventh light signal detectors 92 and none of the bandwidth embodied by the light signals 84 is lost due to beam spread.

Figure 9:
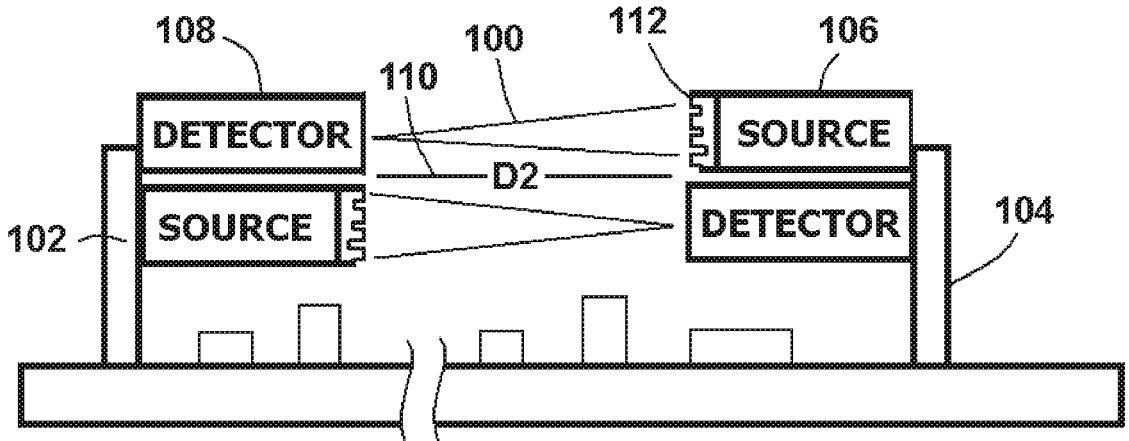
FIG. 9 shows an alternate embodiment of an optical data transfer system where a light signal is communicated laterally within an electronic assembly.

Referring to FIG. 9, it can be seen that a light signal 100 can be transmitted laterally a distance D2 between points on one substrate or between points on different substrates. In this configuration, a light signal 100 carrying optical data is being directly communicated between points within an electronic assembly. The points can be on the same substrate or on different substrates.

Vertical extensions 102, 104 are mounted to the first point and at the second point. Light signal sources 106 are mounted to the vertical extensions 102, 104. Likewise, light signal detectors 108 are also mounted to the vertical extensions 102, 104. The vertical extensions 102, 104 extend outside the range of any intermediate electronic component that can block the light. As such, a clear gap space 110 exists between the substrate extensions 102, 104.

Metalenses 112 are provided to focus the light signals 100. The focal points created by the metalenses 112 are set to be equal to, or very near, the distance D2 of the gap space 110. In this manner, the light signals 100 are focused on the light signal detectors 108 and none of the bandwidth embodied by the light signals 84 is lost due to beam spread. The metalenses 112 have a very small size that does not add significantly to the size of the light signal source 106. Furthermore, the metalenses 112 are low cost compared to conventional concave or convex lenses.

It will be understood that the configurations of the present invention that are illustrated and described are merely exemplary and that a person skilled in the art can make many variations to those embodiments. For instance, features of different configurations can be mixed and matched. Any of the substrates can be transparent, contain holes, and/or contain materials to enable the passage of light. All such embodiments are intended to be included within the scope of the present invention as defined by the claims.

What is claimed is:

1. A system for transmitting a light signal carrying data between circuitry in a stacked configuration of substrates, said system comprising:
   a first substrate having a first top surface and a first bottom surface;
   a second substrate having a second top surface and a second bottom surface wherein said second bottom surface faces said first top surface of said first substrate;
   an interim substrate interposed between said first substrate and said second substrate, wherein said interim substrate has an interim top surface that faces said second substrate and an interim bottom surface that faces said first substrate;
   a light signal source mounted on said first top surface of said first substrate, wherein said light signal source emits said light signal in a wavelength range in a first direction along a first path;
   a light signal detector mounted on said second top surface of said second substrate;
   wherein said light signal passes through both said second substrate and said interim substrate as said light signal travels from said light signal source to said light signal detector.

2. The system according to claim 1, wherein both said second substrate and said interim substrate contain areas that are transparent to said wavelength range of said light signal, wherein said light signal passes through said areas as said light signal travels from said light signal source to said light signal detector.

3. The system according to claim 1, wherein a hole is formed in said interim substrate and said light signal passes through said hole as said light signal travels from said light signal source to said light signal detector.

4. The system according to claim 1, further including a metalens set in said first path that directs said light signal toward said light signal detector.

5. The system according to claim 4, wherein said metalens focuses said light signal toward said light signal detector.

6. The system according to claim 1, wherein said light signal detector is offset from said first path and wherein a metalens is affixed to said light signal source and redirects said light signal away from said first path and toward said light signal detector.

7. The system according to claim 1, further including a metalens set in said first path, wherein said interim substrate adds refractions and distortions to said light signal as said light signal passes through said interim substrate wherein said metalens corrects said light signal for said refractions and distortions as said light signal passes through said metalens.

8. The system according to claim 7, wherein said metalens is disposed between said light signal source and said first substrate.

9. The system according to claim 7, wherein said metalens is disposed between said light signal detector and said second substrate.

* * * * *